US007505279B2

(12) United States Patent
Ohtaki et al.

(10) Patent No.: US 7,505,279 B2
(45) Date of Patent: Mar. 17, 2009

(54) PORTABLE DEVICE HAVING FLEXIBLE CASE

(75) Inventors: Kiyokazu Ohtaki, Niwa-gun (JP); Seiji Ishigaki, Niwa-gun (JP); Daisuke Kawamura, Niwa-gun (JP); Masayuki Kawamura, Niwa-gun (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 826 days.

(21) Appl. No.: 10/766,799

(22) Filed: Jan. 28, 2004

(65) Prior Publication Data

US 2004/0185798 A1 Sep. 23, 2004

(30) Foreign Application Priority Data

Feb. 4, 2003 (JP) ............................ 2003-026919

(51) Int. Cl.
*H05K 5/00* (2006.01)

(52) U.S. Cl. ...................................... 361/752; 361/737

(58) Field of Classification Search ................. 361/752, 361/679, 730, 732, 728–729, 683, 686; 312/223.1; 455/347
See application file for complete search history.

(56) References Cited

U.S. PATENT DOCUMENTS

| | | | | |
|---|---|---|---|---|
| 4,121,160 | A | 10/1978 | Cataldo | 340/321 |
| 4,723,195 | A * | 2/1988 | Mizzi et al. | 361/729 |
| 5,111,199 | A | 5/1992 | Tomoda et al. | 340/825.72 |
| 5,775,148 | A | 7/1998 | Layton et al. | 70/408 |
| 6,193,069 | B1 * | 2/2001 | Guenther et al. | 206/723 |
| 6,674,639 | B2 * | 1/2004 | Wang et al. | 361/683 |
| 6,897,371 | B1 * | 5/2005 | Kurz et al. | 174/382 |
| 2002/0039676 | A1 * | 4/2002 | Ohashi et al. | 429/96 |

FOREIGN PATENT DOCUMENTS

| | | |
|---|---|---|
| DE | 19802300 | 8/1998 |
| DE | 19718453 | 9/1998 |
| JP | 61-49388 | 3/1986 |
| JP | 2001-200664 | 7/2001 |
| JP | 2002-339605 | 11/2002 |

OTHER PUBLICATIONS

European Search Report, dated Mar. 22, 2004, issued in corresponding European Application No. 04001961.4.

* cited by examiner

*Primary Examiner*—Hung S Bui
(74) *Attorney, Agent, or Firm*—Saul Ewing LLP

(57) ABSTRACT

A portable device that resists deformation caused by an external force while remaining water resistant. The portable device includes a case, which is made of a flexible material. A battery compartment is formed in the case. A separable portion is arranged in the part of the case corresponding to the battery compartment. Part of the case is bent to open the separable portion and expose the battery compartment from the case.

14 Claims, 7 Drawing Sheets

PORTABLE DEVICE HAVING FLEXIBLE CASE

BACKGROUND OF THE INVENTION

The present invention relates to a portable device for remotely controlling a device of a vehicle.

Due to the progress in information communication technology and the widespread use of communication devices, remote control is performed in various fields with portable devices. A remote controller used to perform such remote control includes a portable device, which is operated by a user (owner), and a transceiver, which is installed in an external device. For example, the remote control of a household appliance using a cellular phone and the remote control of a vehicle using an electronic key are known in the art.

FIG. 1 shows an example of a portable device 50 described in Japanese Laid-Open Patent Publication No. 2002-339605 used for remotely controlling a vehicle. The portable device includes a case 51, which is made of a synthetic resin and which accommodates a battery 52, a mechanical key 53 used during emergencies, a plurality of electronic components 54, and a circuit board 55. When the battery 52 is drained, a user uses the mechanical key 53 to lock or unlock the door of the vehicle and to start the engine. Referring to FIG. 2, the outer surface of the case 51 includes an opening 56, through which the mechanical key 53 is removed, and a lid 57, which enables the battery 52 to be changed. The lid 57 is normally a slide-type lid such as the one shown in FIG. 2 or a fixed lid fastened by a screw. To improve the portability and convenience, there is a strong demand for a thinner portable device 50.

However, a thinner portable device 50 would decrease the strength of the case 51 and the circuit board 55 that form the portable device 50. For example, when a user carries the portable device 50 in a garment pocket or a wallet, the application of external force to the portable device 50 may deform or damage the case 51 and the circuit board 55. In addition, deformation of the case 51 may cause the lid 57 to fall off from the outer surface of the case 51. This would affect the water resistance of the portable device 50.

SUMMARY OF THE INVENTION

It is an object of the present invention to provide a portable device that resists deformation during the application of external force while remaining water resistant.

To achieve the above object, the present invention provides a portable device for communication with an external device. The portable device includes a case made of a flexible material. A battery compartment is formed in the case. A separable portion is formed in part of the case in correspondence with the battery compartment. The part of the case is deformable to open the separable portion and expose the battery compartment from the case.

A further aspect of the present invention is a portable device for communication with an external device. The portable device includes a case made of a flexible material. A battery compartment is formed in a corner of the case. A separable portion is formed in the corner of the case in correspondence with the battery compartment. The corner of the case is deformable to open the separable portion and expose the battery compartment from the case. The separable portion includes a first connecting surface and a second connecting surface that are arranged adjacent to the battery compartment and are separable from each other. The first connecting surface includes a first fitting portion formed to surround the battery compartment, and the second connecting surface includes a second fitting portion to which the first fitting portion is fitted.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
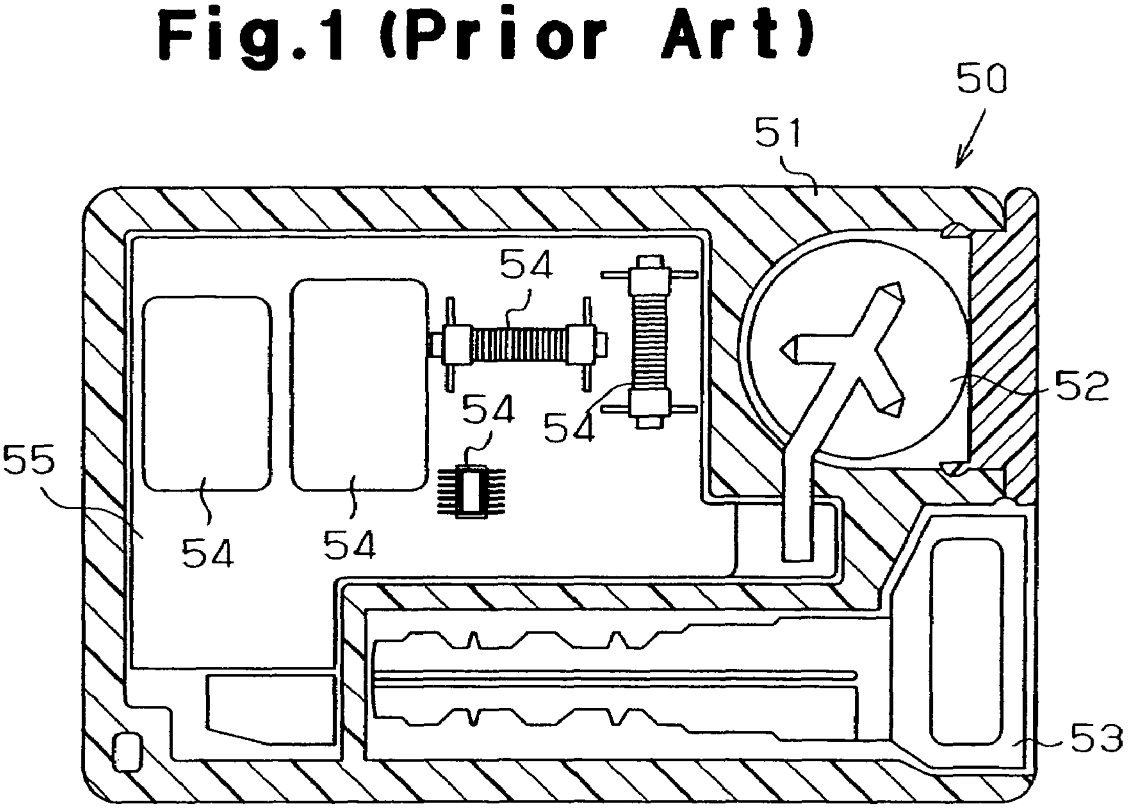
Fig.1 (Prior Art)
FIG. 1 is a cross-sectional view showing a prior art portable device.

In the drawings, like numerals are used for like elements throughout.

First Embodiment

A portable device 120 according to a first embodiment of the present invention will now be discussed with reference to FIGS. 3 to 7.

A remote control apparatus 110 for use in a vehicle includes a portable device 120 having a smart entry function and/or smart ignition function that performs ID verification. The smart entry function automatically unlocks the doors of the vehicle 140 when a user (owner) 15, who is carrying the portable device 120, approaches the vehicle 140 and automatically locks the doors when the user 15 moves away from the vehicle 140. The smart ignition function automatically enables the engine to be started when the user 15 enters the vehicle 140.

Figure 3:
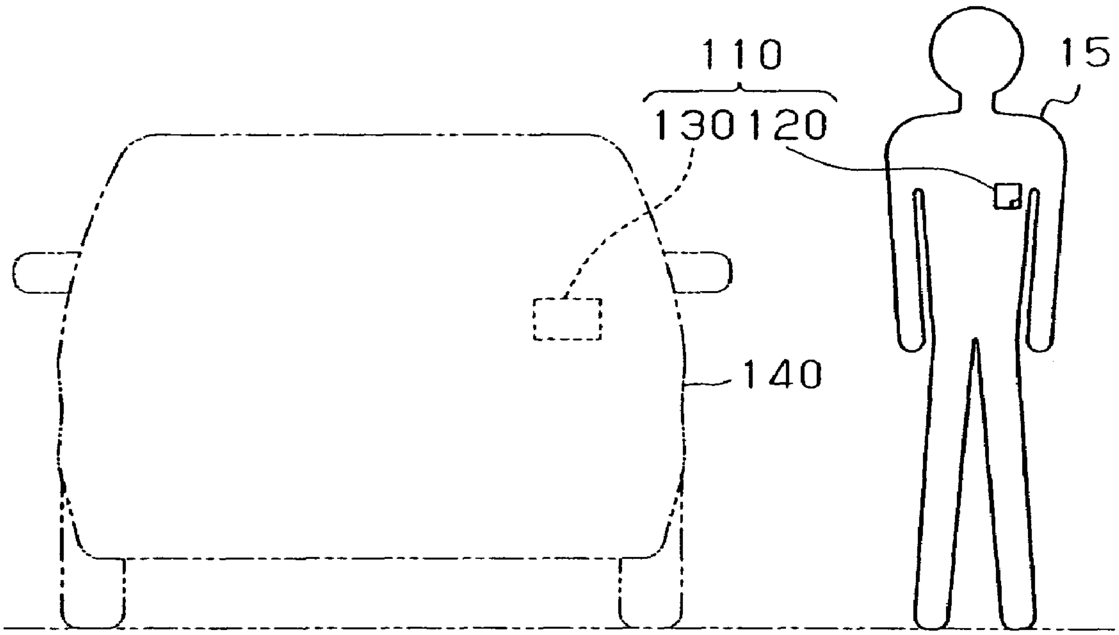
FIG. 3 is a schematic diagram showing a remote control apparatus according to a first embodiment of the present invention.

With reference to FIG. 3, the remote control apparatus 110 includes the portable device 120 and a transceiver 130, which communicates with the portable device 120. The user 15 of the vehicle 140 carries the portable device 120. The transceiver 130 is installed in the vehicle 140 and includes a transmitter circuit, a receiver circuit, and a microcomputer (not shown). Transmitting and receiving antennas (not shown) are connected to the transmitter circuit and the receiver circuit.

For example, in a smart ignition apparatus, the transceiver 130 of the vehicle 140 transmits an ID request signal to the portable device 120. In response to the ID request signal, the portable device 120 transmits an ID signal. The transceiver 130 receives the ID signal. Then, the vehicle 140 compares an ID code, which is included in the ID signal from the portable device 120, with an ID code of the vehicle 140. When the two ID codes match, a signal for enabling the starting of the engine is transmitted to an engine controller (not shown).

Referring to FIGS. 4 to 7, the portable device 120 has a thin case 22. A transmitter circuit 16, a receiver circuit 17, a microcomputer 18, an antenna 19, a circuit board 20, a battery 21, which functions as a power source, and a mechanical key, which is used during emergencies, are arranged in the case 22.

The case 22 includes a base 31 and a cover 32, which are opposed to each other. The cover 32 is adhered to or welded to the base 31. At one corner of the case 22, the cover 32 is not adhered or welded to the base 31. A separable portion 33, which enables the battery 21 of the portable device 120 to be changed, is defined at the corner. The separable portion 33 includes two corner pieces respectively associated with the base 31 and the cover 32. The corner pieces are resiliently deformed in a direction that is generally perpendicular to the plane of the case 22 to form an opening. The entire case 22 is made of a resiliently deformable flexible material. More specifically, the case 22 is made of a resin material, such as a polyethylene resin, a silicon resin, an urethane resin, a polyimide resin, an olefin elastomer resin, or a styrene elastomer resin.

The case 22 is divided into a circuit compartment 22*a*, in which the circuit board 20 is accommodated, a battery compartment 22*b*, in which the button-like battery 21 is accommodated, and a mechanical key compartment 22*c*, in which the mechanical key 23 is accommodated. For example, the transmitter circuit 16, the receiver circuit 17, the microcomputer 18, and the antenna 19 are connected to the circuit board 20. The circuit board 20 is preferably a flexible print circuit (FPC) board, which is flexible and bendable. In a flexible print circuit board, for example, a conductive circuit is printed or etched to a polyester (PET) film.

A terminal 25 extends from an end of the circuit board 20. The material of the terminal 25 is an anisotropic conductor (e.g., INTERCONNECTOR manufactured by Shinetsu Polymer Co., Ltd.), which is formed by bonding metal fibers 26 with an insulative silicon resin 27. When the cover 32 is attached to the base 31, an elastic force is applied to the terminal 25, which is made of the anisotropic conductor. Accordingly, the distal end of the terminal 25, which presses the battery 21, is kept in contact with the battery 21. In this state, the battery 21 supplies power via the terminal 25 to the electronic devices connected to the circuit board 20, such as the transmitter circuit 16, the receiver circuit 17, and the microcomputer 18.

The two corner pieces of the base 31 and cover 32 that form the separable portion 33 respectively have a first connecting surface 31*a* and a second connecting surface 32*a* that are connected to each other when the separable portion 33 is closed. The battery compartment 22*b* is located adjacent to the first and second connecting surfaces 31*a* and 32*a*. When the separable portion 33 is opened, the battery compartment 22*b* is exposed. A lip 36 extends from the first connecting surface 31*a* around part of the battery compartment 22*b* on the corner piece of the base 31. The lip 36 is generally U-shaped to partition the separable portion 33 and the battery compartment 22*b*. A groove 37 extends in the second connecting surface 32*a* of the corner piece of the cover 32 in correspondence with the lip 36. When the separable portion 33 is closed, the lip 36 is fitted to the groove 37 through a concavo-convex relationship. In this state, the fitting of the lip 36 and the groove 37 results in the separable portion 33 being water resistant.

Figure 4:
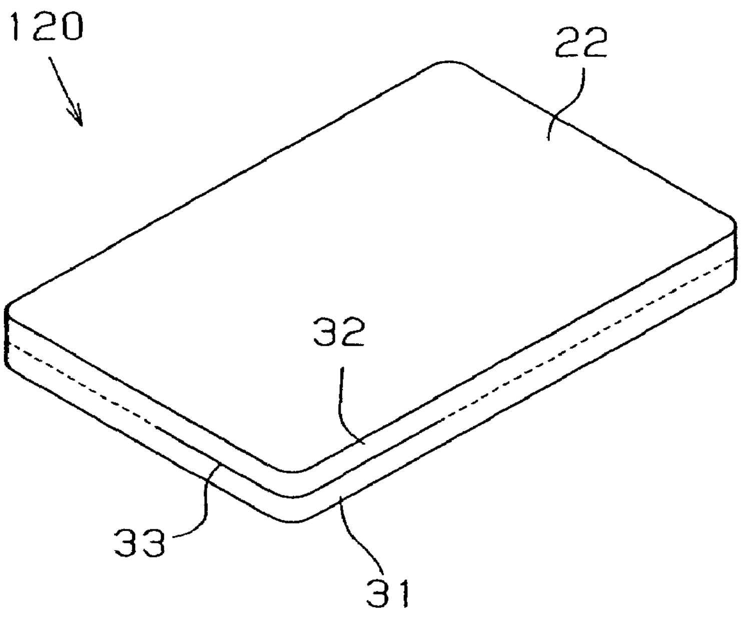
FIG. 4 is a perspective view showing a separable portion of a portable device in a closed state in the first embodiment.
Figure 5:
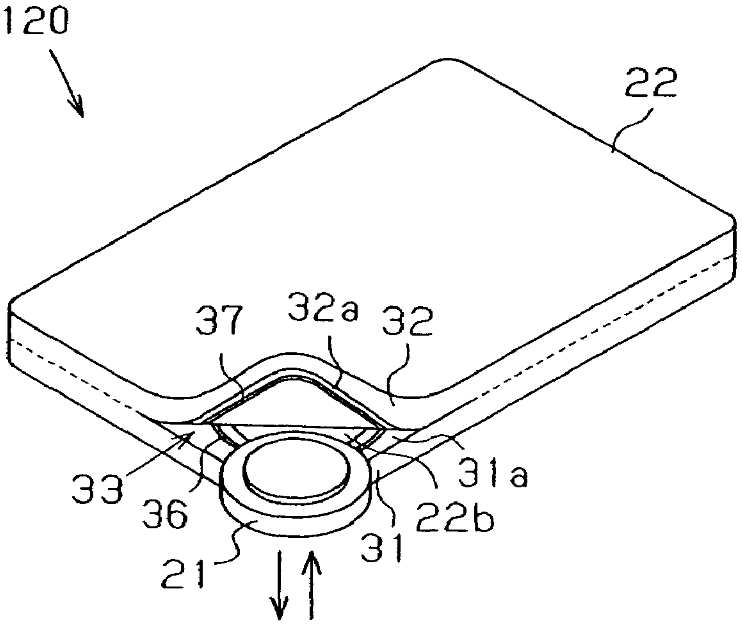
FIG. 5 is a perspective view showing the separable portion of the portable device in an opened state in the first embodiment.
Figure 6:
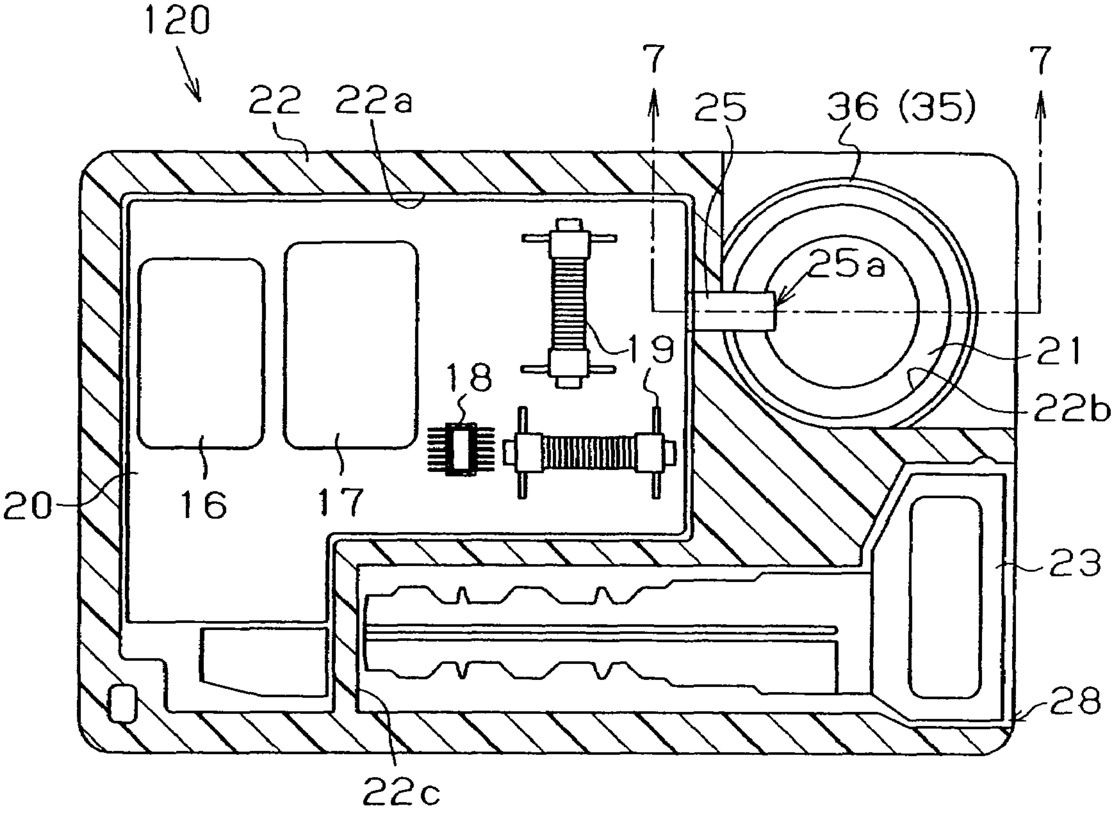
FIG. 6 is a cross-sectional view of the portable device shown in FIG. 4.
Figure 7:
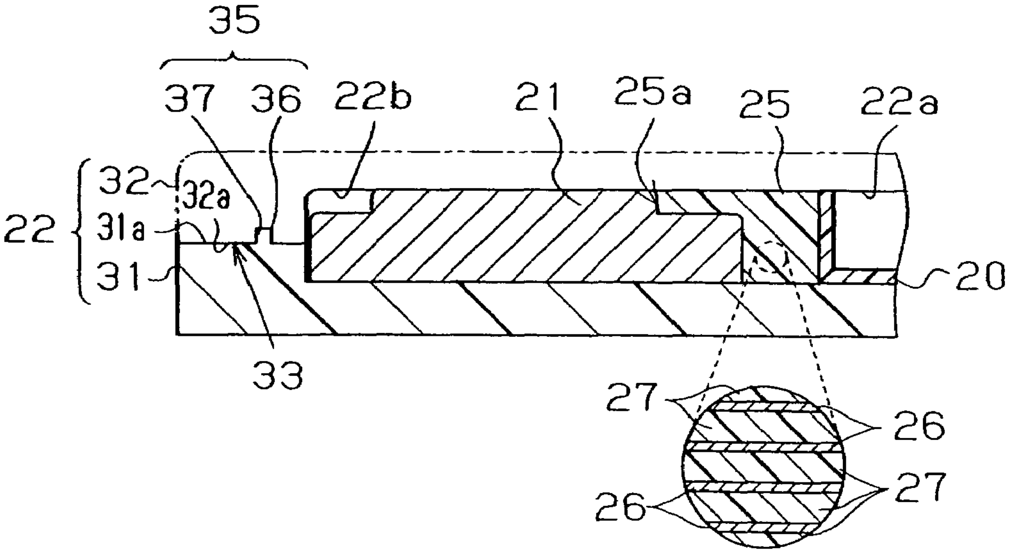
FIG. 7 is a cross-sectional view taken along line 7-7 in FIG. 6.

The procedures for changing the battery 21 will now be discussed with reference to FIGS. 4 and 5.

The user 15 first bends the area near the corner of the case 22 to separate the corner pieces of the base 31 and the cover 32 from each other. This separates the lip 36 of the base 31 from the groove 37 of the cover 32. In this state, the separable portion 33 is opened at one corner of the case 22 and the battery compartment 22*b* is exposed from the case 22. The user 15 removes the used battery 21 from the battery compartment 22*b* through the opened separable portion 33.

Then, the user 15 inserts the new battery 21 in the battery compartment 22*b* through the opened separable portion 33. Subsequently, the user 15 bends back the area near the corner of the case 22 to connect the corner pieces of the base 31 and the cover 32 to each other. As a result, the lip 36 of the base 31 is fitted to the groove 37 of the cover 32, the first connecting surface 31*a* of the base 31 is connected to the second connecting surface 32*a* of the cover 32, and the separable portion 33 is closed. In this state, the fitting of the lip 36 and the groove 37 results in the separable portion 33 being water resistant.

The portable device 120 of the first embodiment has the advantages described below.

(1) The case 22 is made of a resiliently deformable flexible material. Thus, by bending the area near a corner of the case 22, the separable portion 33 is opened to expose the battery compartment 22*b*. The opening of the separable portion 33 enables the user 15 to remove the battery 21 from the battery compartment 22*b* and easily insert the battery 21 in the battery compartment 22*b*.

Figure 2:
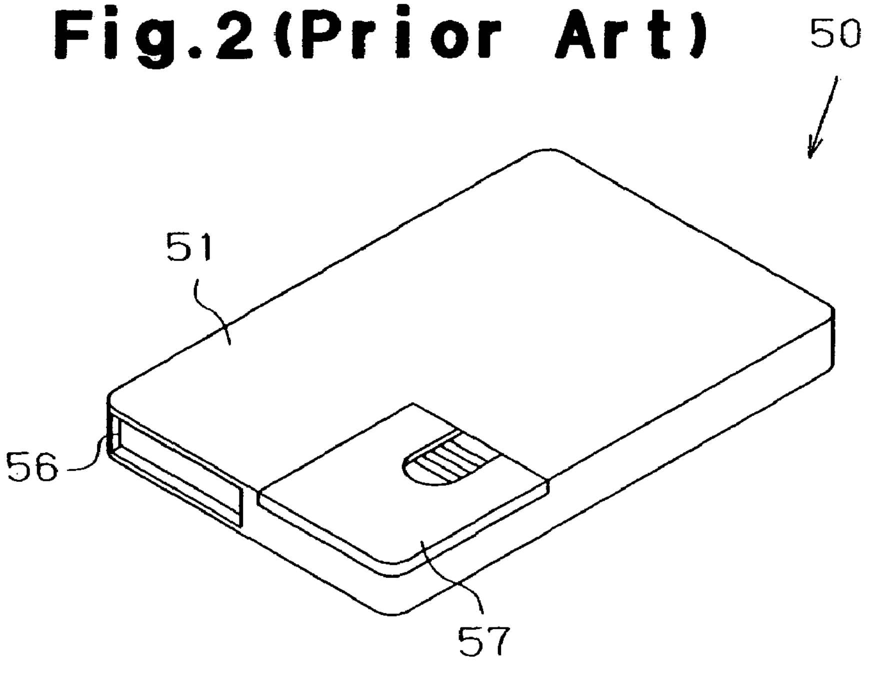
Fig.2 (Prior Art)
FIG. 2 is a perspective view showing the prior art portable device.

(2) The case 22 of the portable device 120 is bent to open the separable portion 33 and change the battery 21. This eliminates the need for a lid 57, such as that shown in FIG. 2. Further, when the user 15 is carrying the portable device 120, there is no battery lid that would fall off the portable device 120. This keeps the portable device 120 water resistant.

(3) The case 22 is made of a resiliently deformable flexible material. Since the case 22 is flexible, the case 22 may be bent by applying an external force to the case 22. Thus, even if an excessive external force is applied to the portable device 120, the case 22 is deformed in accordance with the force and resists cracking. This improves the resistance of the portable device 120 with respect to external forces.

(4) The separable portion 33 that exposes the battery compartment 22*b* is arranged in a corner of the case 22. The battery compartment 22*b* is located at a position where it is easily exposed from the separable portion 33. This enables the user 15 to easily change the battery 21 and improves the convenience of the portable device 120.

(5) The fitting of the lip 36 of the base 31 to the groove 37 of the cover 32 through the concavo-convex relationship makes the separable portion 33 water resistant.

(6) The case 22 is made of a flexible resin material, such as a polyethylene resin, a silicon resin, an urethane resin, a polyimide resin, an olefin elastomer resin, or a styrene elastomer resin. Since the case 22 is flexible, the portable device 120 resists deformation when external force is applied thereto. Further, the first connecting surface 31*a* of the base 31 comes into close contact with the second connecting surface 32*a* of the cover 32. The separable portion 33 has a water-resistant sealing effect and improves the water resistance of the portable device 120.

(7) The circuit board 20 is a flexible print circuit board. Thus, even when an excessive external force is applied to the portable device 120, the circuit board 20 is resiliently deformed and resists cracking. This improves the resistance to deformation of the portable device 120 when an external force is applied thereto.

(8) The terminal 25 that supplies power from the battery 21 to the circuit board 20 is an anisotropic conductor, which is formed by bonding the metal fibers 26 with the insulative silicon resin 27. The terminal 25 is electrically connected to the battery 21 in a state in which the distal end 25*a* of the terminal 25 is pressed against the battery 21. This keeps the distal end 25*a* of the terminal 25 securely held on the battery 21 and improves the reliability of the portable device 120.

(9) The mechanical key 23 is accommodated in the case 22. When the voltage of the battery 21 decreases, the user 15 uses the mechanical key 23 to lock and unlock the doors and to start the engine. This improves the convenience of the portable device 120.

Second Embodiment

A portable device 40 according to a second embodiment of the present invention will now be discussed with reference to FIGS. 8 to 13.

Figure 8:
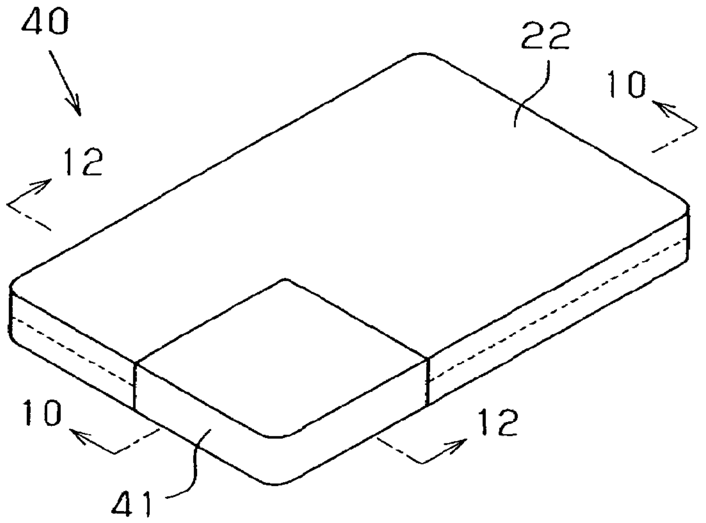
FIG. 8 is a perspective view showing a portable device according to a second embodiment of the present invention in which a separable portion is closed.
Figure 9:
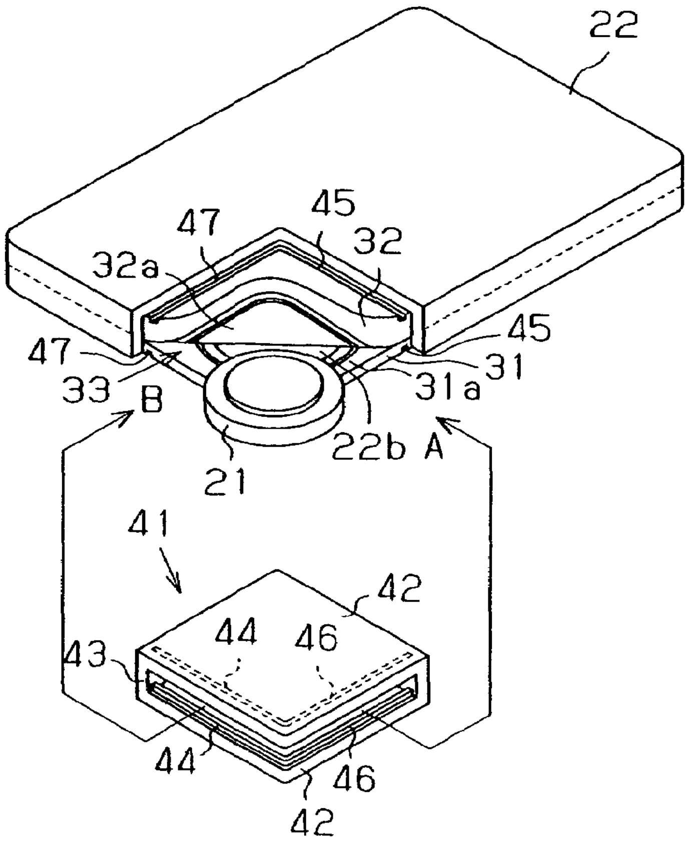
FIG. 9 is a perspective view showing the portable device in an opened state and a clip.

Referring to FIGS. 8 and 9, the portable device 50 includes a clip 41, which is attached to the case 22 and which functions as a holding means. The clip 41 covers the separable portion 33 and keeps the separable portion 33 closed. More specifically, the clip 41 has an L-shaped base 43, which is shaped to correspond to the edges of the separable portion 33 and two square holding pieces 42, which are opposed to each other. The two holding pieces 42 define an opening for the clip 41 therebetween. The space between the two holding pieces 42 narrows as the distance from the base 43 becomes greater. In the clip 41, the two holding pieces 42 are deformed with the base 43 functioning as a fixed point. The clip 41 has a U-shaped cross-section to hold the separable portion 33 in the clip 41. The clip 41 is detachably attached to the case 22 with the separable portion 33, with the two surfaces on opposite sides of the corner of the case 22 held between the two holding pieces 42. The clip 41 is made of a hard material, such as metal or resin.

Figure 10:
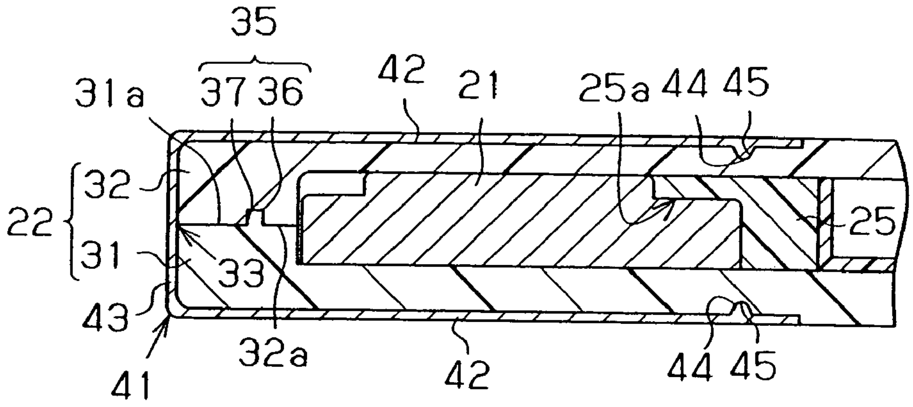
FIG. 10 is a partial cross-sectional view showing the portable device of FIG. 8 taken along line 10-10.
Figure 11:
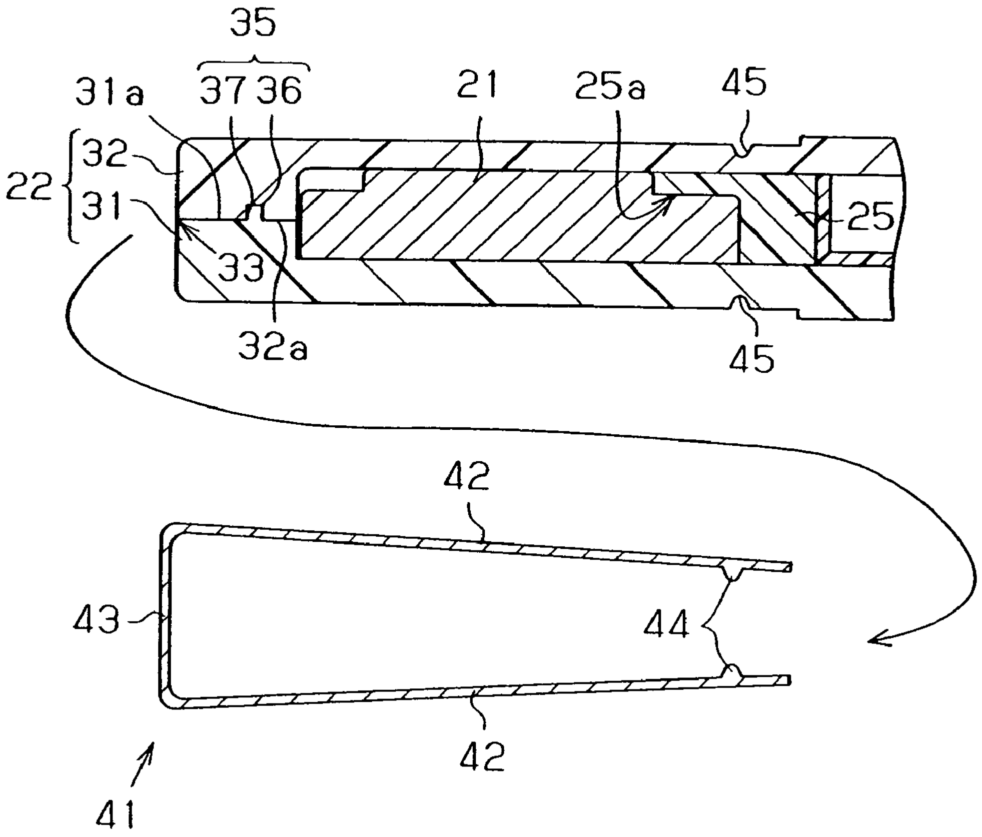
FIG. 11 is a partial cross-sectional view of FIG. 10 in a state in which the clip is removed from the portable device.
Figure 12:
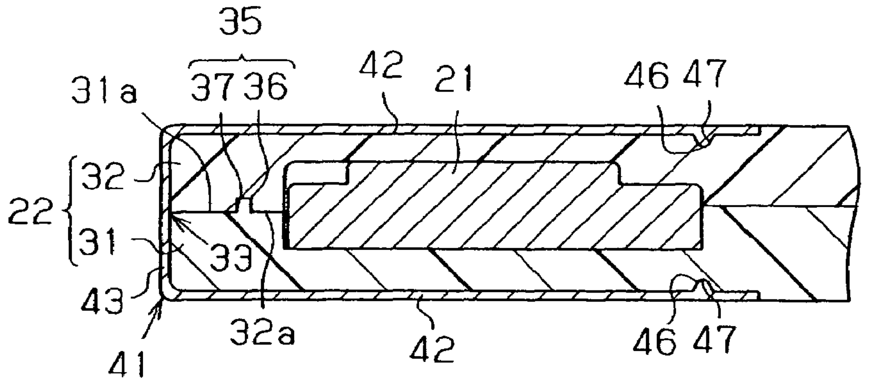
FIG. 12 is a partial cross-sectional view taken along line 12-12 in FIG. 8.
Figure 13:
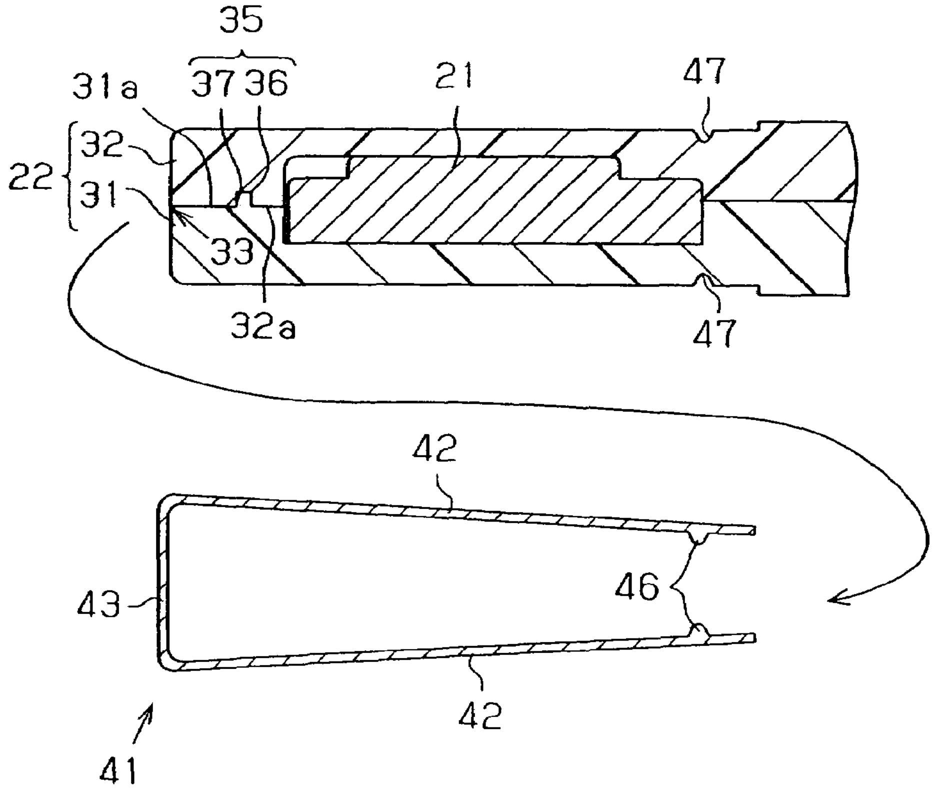
FIG. 13 is a partial cross-sectional view of FIG. 12 in a state in which the clip is removed from the portable device.

FIGS. 10 and 11 are cross-sectional views of the portable device 40 taken along line 10-10 in FIG. 8, and FIGS. 12 and 13 are cross-sectional views of the portable device 40 taken along line 12-12 in FIG. 8. In the case 22, the portion of the case 22 to which the clip 41 is attached is thinner than the other portions of the case 22 by an amount corresponding to the thickness of the two holding pieces 42. Thus, when the clip 41 is attached to the case 22, the surface of the clip 41 is flush with the surface of the case 22. Further, the distal portion of the clip 41 is located at a position at which the battery 21 and the terminal 25 are in contact with each other. Accordingly, the attachment of the clip 41 to the case 22 increases the contact pressure between the battery 21 and the terminal 25.

The attachment of the clip 41 to the case 22 from direction A (the lateral direction of the portable device 40) will now be discussed. As shown in FIGS. 9 to 13, projections 44 and 46 are formed at the edges on the inner surfaces of the two holding pieces 42 near the opening of the clip 41. Pits 45 and 47, which respectively correspond to the projections 44 and 46, are formed in the surfaces of the case 22 at the corner to which the clip 41 is attached. When the user 15 attaches the clip 41 to the case 22 from direction A, the projections 44 of the clip 41 are received and guided by the pits 45.

When the attachment of the clip 41 to the case 22 is completed, the projections 46 of the clip 41 are engaged with the pits 47 of the case 22.

The procedure for attaching the clip 41 to the case 22 will now be discussed with reference to FIGS. 9 to 13.

The user 15 first engages the projections 44 of the two holding pieces 42 with the pits 45 of the case 22. Then, the clip 41 is attached from direction A to the case 22 along the pits 45. In this state, the clip 41 is attached to the case 22 while sliding the inner surfaces of the holding pieces 42 along the associated surfaces of the case 22. After the attachment of the clip 41 is completed, the projections 46 of the two holding pieces 42 are engaged with the pits 47 of the case 22. In this state, the inner surfaces of the two holding pieces 42 press the corner of the case 22.

To remove the clip 41, the user 15 first separates the projections 46 of the clip 41 from the pits 47 of the case 22. Then, the user 15 removes the clip 41 from the case 22 along the pits 45. In the second embodiment, when changing the battery 21, the user 15 performs the same procedures as the first embodiment after the clip 41 is removed from the case 22.

The portable device 40 of the second embodiment has the advantages described below.

(10) The clip holds the separable portion 33, or the surfaces at the corner of the case 22. The attachment of the clip 41 firmly connects the first and second connecting surfaces 31*a* of the corner pieces at the base 31 with each other and improves the sealing of the separable portion 33. This prevents water from entering the case 22 through the separable portion 33. Thus, the water resistance of the portable device 40 is improved.

(11) The clip 41 clamps the separable portion 33, or the surfaces at the corner of the case 22. The attachment of the clip 41 to the case 22 increases the contact pressure between the battery 21, which is arranged in the battery compartment 22*b*, and the terminal 25, which supplies the power of the battery 21 to the circuit board 20. This keeps the terminal 25 securely held on the battery 21 and improves the reliability of the portable device 40.

(12) The clip 41 is made of a hard material such as metal or resin. The attachment of the clip 41 to the separable portion 33 connects the first connecting surface 31*a* of the base 31 and the second connecting surface 32*a* of the cover 32 with a strong force. This improves the sealing of the separable portion 33 and increases the contact pressure between the battery 21 and the terminal 25. Accordingly, the water resistance and reliability of the portable device 40 are further improved.

(13) The clip 41 has substantially the same area as the battery compartment 22*b*. Thus, even if the clip 41 is made of metal, the blocking of radio waves is minimized, and the communication capability of the portable device 40 is not lowered.

(14) The clip 41 is formed so that the distance between the two holding pieces 42 narrows as the distance from the base 43 increases. Thus, the attachment of the clip 41 applies pressure with the two holding pieces 42 to the associated surfaces at the corner of the case 22. This further connects the connecting surfaces 31*a* and 32*a* of the separable portion 33 with a stronger force.

(15) The projections 44 are formed in the clip 41, and the corresponding pits 45 are formed in the associated surfaces of the case 22. Thus, when the user 15 attaches the clip 41 to the case 22 from direction A, the projections 44 of the clip 41 are received in the pits 45 of the case 22. This enables the user 15 to easily attach the clip 41 to the case 22.

(16) When the attachment of the clip 41 to the case 22 is completed, the projections 44 and 46 of the clip 41 are respectively engaged with the pits 45 and 47 of the case 22. This makes it difficult for the clip 41 to fall off from the case 22.

(17) When the clip 41 is attached to the case 22, the surface of the clip 41 is flush with the surface of the case 22. Since the portable device 40 has a smooth surface, the portable device 40 does not get caught in the fabric of clothing. Thus, the portable device 40 may easily be put into or removed from a garment pocket or a wallet by the user 15. This improves the portability of the portable device 40.

It should be apparent to those skilled in the art that the present invention may be embodied in many other specific forms without departing from the spirit or scope of the invention. Particularly, it should be understood that the present invention may be embodied in the following forms.

In the first and second embodiments, the portable device 120 and 40 are used in a vehicle provided with a smart entry function and a smart ignition function. However, a portable device according to the present invention may be used, for example, when remotely controlling the locking and unlocking of a door of a house or when remotely controlling a household electrical appliance or a personal computer using a cellular phone.

In the first and second embodiments, the base 31 and the cover 32 are adhered or welded to each other to form the case 22. However, the case 22 may be formed through other methods. For example, potting or casting may be performed by pouring a thermosetting resin into a mold and then hardening the resin to form the base 31 and the cover 32 integrally with each other.

In the first and second embodiments, the separable portion 33, from which the battery compartment 22*b* is exposed, is arranged at one corner of the case 22. However, the separable portion 33 may be arranged at any position in accordance with the location of the battery compartment 22*b*.

In the first and second embodiments, the separable portion 33, which is water resistant, includes the lip 36 formed on the base 31 and the groove 37 formed in the cover 32. However, the cover 32 may have the lip 36, and the base 31 may have the groove 37.

In the first and second embodiments, the water resistant structure formed by the lip 36 and the groove 37 is generally U-shaped to partition the separable portion 33 and the battery compartment 22*b*. However, the water resistant structure may be circular to encompass the entire battery compartment 22*b*.

In the first and second embodiments, the terminal 25, which supplies power from the battery 21 to the circuit board 20, is an anisotropic conductor, which is formed by bonding the metal fibers 26 with the insulative silicon resin 27. However, a metal terminal 25 may be used in lieu of the anisotropic conductor.

In the second embodiment, the user 15 may attach the clip 41 to the case 22 from direction B (the longitudinal direction of the portable device 40) instead of from direction A of FIG. 9. In this case, the clip 41 is attached to the case 22 by guiding the projections 46 with the pits 47.

The present examples and embodiments are to be considered as illustrative and not restrictive, and the invention is not to be limited to the details given herein, but may be modified within the scope and equivalence of the appended claims.

What is claimed is:

1. A portable device for communication with an external device, the portable device comprising:

a case made of a flexible material;

a battery compartment defined in the case; and a separable portion formed in pan of the case in correspondence with the battery compartment, said part of the case being deformable to open the separable portion and expose only the battery compartment from the case, wherein the separable portion includes a first connecting surface and a second connecting surface that are arranged adjacent to the battery compartment and are separable from each other, the first connecting surface including a first fitting portion formed to surround the battery compartment, and the second connecting surface including a second fitting portion to which the first fitting portion is fitted.

2. The portable device according to claim 1, wherein the case is made of a resin selected from the group consisting of a polyethylene resin, a silicon resin, an urethane resin, a polyimide resin, and olefin elastomer resin, and a styrene elastomer resin.

3. The portable device according to claim 1, further comprising:

a flexible print circuit board accommodated in the case adjacent to the battery compartment.

4. The portable device according to claim 1, wherein the case includes:

a base; and a cover, part of the cover covering the battery compartment, with a section of the base and the cover forming the separable portion.

5. The portable device according to claim 1, further comprising:

a holding means detachably attached to the case to hold the separable portion in a closed state.

6. The portable device according to claim 5, wherein the holding means includes a pair of pieces that hold the separable portion therebetween.

7. The portable device according to claim 6, wherein the pair of pieces has an area that is substantially the same as that of the battery compartment.

8. The portable device according to claim 5, wherein the holding means includes a base shaped in correspondence with edges of the separable portion and a pair of opposed holding pieces for holding the separable portion therebetween, the holding means being formed so that distance between the pair of holding pieces decreases as distance from the base increases.

9. The portable device according to claim 5, further comprising:

a circuit board, to which electronic components are connected, accommodated in the case;

a terminal having a first end connected to the circuit board and a second end for contacting the battery in the battery compartment, with the holding means pressing the second end of the terminal against the battery when holding the separable portion.

10. The portable device according to claim 5, wherein one of the holding means and the separable portion includes a projection and the other one of the holding means and the separable portion includes a pit engaged with the projection.

11. The portable device according to claim 10, wherein the projection and the pit are formed to guide the holding means when attaching the holding means to the case.

12. The portable device according to claim 5, wherein the holding means has a surface that is flush with the surface of the case when the holding means is attached to the case.

13. A portable device for communication with an external device, the portable device comprising:

a case made of a flexible material;

a battery compartment defined in a corner of the case; and a separable portion formed in the corner of the case in correspondence with the battery compartment, the corner of the case being deformable to open the separable portion and expose only the battery compartment from the case, wherein the separable portion includes a first connecting surface and a second connecting surface that are arranged adjacent to the battery compartment and are separable from each other, the first connecting surface including a first fitting portion formed to surround the battery compartment, and the second connecting surface including a second fitting portion to which the first fitting portion is fitted.

14. The portable device according to claim 13, further comprising: a holder including a base shaped in correspondence with edges of the corner of the case and a pair of opposed holding pieces for holding the separable portion therebetween, and the separable portion being thinner in correspondence with the thickness of the pair of holding pieces.

* * * * *